United States Patent
Stoemmer et al.

(10) Patent No.: US 7,385,467 B2
(45) Date of Patent: Jun. 10, 2008

(54) RESONATOR AND COMPONENT WITH HERMETIC ENCAPSULATION

(75) Inventors: Ralph Stoemmer, Neubiberg (DE); Habbo Heinze, Unterschleissheim (DE)

(73) Assignee: EPCOS AG, Munich (DE)

( * ) Notice: Subject to any disclaimer, the term of this patent is extended or adjusted under 35 U.S.C. 154(b) by 136 days.

(21) Appl. No.: 10/523,872

(22) PCT Filed: Jun. 23, 2003

(86) PCT No.: PCT/EP03/06597

§ 371 (c)(1), (2), (4) Date: Feb. 7, 2005

(87) PCT Pub. No.: WO2004/021568

PCT Pub. Date: Mar. 11, 2004

(65) Prior Publication Data

US 2006/0164186 A1   Jul. 27, 2006

(30) Foreign Application Priority Data

Aug. 27, 2002   (DE) ................ 102 39 317

(51) Int. Cl.
*H03H 9/54* (2006.01)
*H03H 3/007* (2006.01)
(52) U.S. Cl. .............. 333/189; 333/191; 333/192
(58) Field of Classification Search ........ 333/189, 333/191, 192; 310/324, 335, 336
See application file for complete search history.

(56) References Cited

U.S. PATENT DOCUMENTS

| 5,872,493 | A | 2/1999 | Ella |
| 6,087,198 | A | 7/2000 | Panasik |
| 6,441,703 | B1 * | 8/2002 | Panasik ................ 333/189 |
| 6,744,336 | B1 * | 6/2004 | Goetz et al. ............ 333/193 |
| 6,768,396 | B2 * | 7/2004 | Klee et al. ............. 333/187 |
| 2001/0028285 | A1 | 10/2001 | Katharine et el. |

FOREIGN PATENT DOCUMENTS

| EP | 0 865 157 | 9/1998 |
| EP | 1 070 677 | 1/2001 |
| EP | 1 071 126 | 1/2001 |

* cited by examiner

*Primary Examiner*—Stephen E. Jones
(74) *Attorney, Agent, or Firm*—Fish & Richardson P.C.

(57) ABSTRACT

Proposed is a resonator which works with bulk acoustic waves and is based on a layer structure known in the art, which is arranged over a substrate. According to the invention, the total surface of the layer structure, including all resonators contained therein, is covered with a dielectric layer and a metal layer which together form an acoustic mirror, a low-k dielectric being used for the dielectric layer. The total-surface mirror offers broadband functionality over a suitable frequency range. The dielectric contained within the mirror acts as a sealing protective layer for the resonator or resonators.

25 Claims, 3 Drawing Sheets

RESONATOR AND COMPONENT WITH HERMETIC ENCAPSULATION

TECHNICAL FIELD

This patent application describes a resonator working with bulk acoustic waves, such as a bulk acoustic wave resonator or thin-film acoustic resonator (BAW resonator or FBAR resonator), and a component having hermetic encapsulation and containing one or a plurality of such resonators.

BACKGROUND

Resonators are suitable for use in bandpass filters in modern filter technology and may, for example, be used in mobile communication devices.

A resonator working with bulk acoustic waves has a piezoelectric layer arranged between two metal layers (electrodes). The layers are sequentially deposited on a substrate and structured in such a manner that there arises a plurality of resonators, which are electrically connected by their correspondingly structured electrodes and may together realize a filter circuit, for example.

To store the acoustic energy of the bulk acoustic wave within the resonator and/or to keep acoustic energy in the substrate upon which the resonator is arranged from escaping, either an acoustic mirror is arranged underneath the resonator or an air gap is provided. An acoustic mirror includes at least two, but maybe more layers, alternately comprised of materials having high and low acoustic impedance. The material and the thickness of these layers are so chosen that, for the selected resonant frequency of the resonator, all layer thicknesses are in the range of a quarter wavelength (or an odd multiple of a quarter wavelength) of the acoustic wave that can propagate in the respective material at this frequency. Under these conditions, the theoretical ideal case of maximum constructive interference of the acoustic waves reflected on the boundary layers is approximately optimized and thus prevents the escape of acoustic energy from the resonator.

An air gap also serves the same purpose, because the large impedance jump between the top (or bottom) layer of the resonator and the air is sufficient to reflect the acoustic wave almost completely.

A resonator working with bulk acoustic waves or a component that exhibits such resonators is just as sensitive as a surface acoustic wave (SAW) component to mass load or to damage from contaminating substances on the surface of the resonators. Component housings known from semiconductor technology in which the components are built-in, glued-in, for example, are thus normally used for such FBAR resonators and components. Such housings, which include ceramics or metal, for example, have two parts, comprised, for example, of a trough and a lid or a carrier and a cap, the two parts of the housing being glued, welded, or soldered together after the component has been inserted.

Such housing technologies demand high procedural and financial costs, however, and cannot keep up with the miniaturization of the components because of the required minimum dimensions, of wall thicknesses, for example, this miniaturization being required for technological and economic reasons. It is therefore proposed in U.S. Pat. No. 6,087,198 that the packaging be replaced by an external seal using a plastic material. To prevent the plastic seal from having a negative effect on the acoustic properties of the resonator, an acoustic mirror is provided between the resonator and the seal. U.S. Pat. No. 5,872,493 also describes a seal, which is deposited over the component and comprises at least one passivation layer comprised of $SiO_2$, an epoxy resin or a desired glob-top composition. Here too, an acoustic mirror comprising at least three mirror layers is inserted therebetween to prevent acoustic interference with the resonator.

SUMMARY

This patent application describes an acoustic mirror, which comprises a dielectric and a metal layer, provided over a conventionally built resonator. The dielectric layer is so designed that it represents a hermetic seal for the resonator or resonators at the same time. In the component, the metal layer that forms the second layer of the acoustic mirror may serve for electromagnetic shielding in an advantageous manner. A specially constructed acoustic mirror already achieves a seal in the resonator without additional encapsulating layers over the acoustic mirror.

The dielectric layer is so chosen that it alone ensures adequate hermetic sealing of the resonator or a component constructed therefrom. A resonator is therefore simply constructed and less expensive.

An advantageous acoustic mirror effect is achieved when the layer thicknesses of the dielectric layer and metal layer are so chosen as a function of the material used that their thickness corresponds to approximately one fourth of the wavelength (or to an odd multiple of a quarter wavelength) of the bulk acoustic wave that can be propagated in the corresponding material.

Moreover, the reflection of the acoustic mirror is affected by a difference in the acoustic impedance of the two mirror layers, this difference being as large as possible. In an embodiment it is therefore proposed that an organic layer, a low-k dielectric in particular, be used for the dielectric layer. These kinds of materials on electronic components are known as dielectrics and are here proposed for the first time as a functional constituent part for components working with bulk acoustic waves. These low-k dielectrics are characterized by an extraordinarily low acoustic impedance and usually also have extraordinarily good insulating and sealing properties, making them appropriate for the sealing mirror-layer.

Described herein is an acoustic mirror that exhibits two suitable mirror layers (dielectric layer and metal layer) of low and high acoustic impedance respectively. If the encapsulation is also required to have high physical strength, then it is proposed in a further development that at least one other layer or another pair of layers be so arranged over the acoustic mirror that there results an alternating sequence of layers of relatively low acoustic impedance and layers of relatively high acoustic impedance. Since a sufficiently high acoustic impedance can already be obtained with the first two layers, namely the dielectric layer and the metal layer, both the selection of the material and the precise layer thickness are less critical for the acoustic mirror layers to be arranged thereon than in the case of the first two layers. Other materials, particularly less costly materials, which would be less suitable or unsuitable for the acoustic mirror itself comprising a dielectric layer and metal layer, therefore also come into consideration for the additional single layers or layer pairs to be deposited thereon.

A single resonator may be used. Since usual applications of resonators working with bulk acoustic waves are usually filter circuits, a circuit comprising a plurality of interconnected resonators may also be encapsulated. Such a circuit arrangement is normally structured out of a common layer structure comprising at least a first electrode, a piezoelectric layer and a second electrode. A suitable interconnection of the individual resonators, which may represent a ladder-type circuit or a lattice circuit for example, is achieved by appropriate structuring steps of the electrode layers and possibility also of the piezoelectric layer. Such a circuit arrangement may comprise an arbitrary number of resonators. In a ladder-type structure, at least two resonators are needed for a simple filter effect. The structure may be supplemented with additional resonators to increase the selectivity of the filter. The resonators, which are structured from the common layer structure and interconnected together, are mutually covered with a dielectric and metal layer. To prevent a capacitive coupling of the resonators across the metal layer and possibly other electrically conducting layers deposited thereon, these layers may be electrically separated on the basis of the resonators.

The layer structure is produced through the thin-film process by depositing the single layers sequentially on top of each other on a wafer, possibly arranging an acoustic mirror or other fit-inducing and growth-inducing layers therebetween. Such a wafer may comprise of conventional substrate materials, especially silicon, gallium arsenide, glass, ceramics or any other substances suitable as carrier material. Due to the small sizes of resonators or of components produced from a plurality of resonators, it is possible to produce from one layer structure a large number of components simultaneously and in parallel on one wafer. It is then also possible to deposit the dielectric and metal layer total-surface over all components produced on one wafer. It is moreover possible and advantageous to arrange additional active or passive circuit elements on the wafer and interconnect them integrated with the resonators. Such active and passive circuit elements may also be mutually covered with the seal, comprising the dielectric layer and the metal layer.

After the last layer has been deposited and possibly structured, the components are separated across the entire layer structure, including the substrate, by a sawing process, for example. There is no disadvantage in exposing the dielectric layer on the lips of the individual components, because it is exclusively the dielectric layer that provides the sealing action. The metal layer serves exclusively as a layer of high acoustic impedance for the acoustic mirror and, with a suitable electrical connection, may serve as an electromagnetic shielding layer.

As already mentioned, on the wafer it is possible to build circuits comprising active and passive circuit elements in addition to the resonators, especially microstrip transmission lines, inductance coils, capacitors, transistors, diodes, and resistors. With the aid of the resonators and the additional circuit elements, it is possible to produce circuits such as a high-frequency circuit, adaptation circuit, antenna circuit, diode circuit, transistor circuit, highpass filter, lowpass filter, bandpass filter, tuning filter, bandstop filter, power amplifier, preamplifier, LNA, diplexer, duplexer, coupler, directional coupler, memory element, balun, mixer, or oscillator. No acoustic mirror is indeed needed for the other circuit and matching elements, but here too the dielectric layer deposited on the total surface serves as a sealing layer and the metal layer serves as electromagnetic shielding for the circuit elements.

A desirable and attainable property for the dielectric layer is its well-reproducible capability of being deposited in a thin-film process, including control of the layer thickness. Also desirable and advantageous is a low dielectric constant, low water permeability, low water absorption and, in particular, low acoustic impedance.

All of these properties are advantageously realized in a benzocyclobutene. Benzocyclobutenes are known from the semiconductor industry, under the name Cycloten®, for example, and are used in particular as intermediate layers, dielectrics and sealing layers for microelectronic circuits. Advantageous in particular are the low dielectric constant and the good layer properties, especially the high layer homogenicity that can be attained with a benzocyclobutene.

Benzocyclobutenes may be diversely substituted to accentuate or strengthen desired material properties. Under the action of heat, they polymerize into partially aromatic polycyclic systems, which are nearly chemically inert. In the thin-film process, benzocyclobutenes may be deposited with high layer thickness accuracy, so that it is particularly simple to produce a dielectric layer that is lambda-quarter thick as precisely as possible for a component. The effect of the elastic properties of the dielectric may be such that it is possible to partially or completely compensate for layer stress, which can build up on the boundary surfaces to layers lying below or to layers deposited thereabove due to the different thermal expansion coefficients of the layers. Dielectrics based on linked stable polymers are used as stress compensation layers for manufacturing integrated optic components in the semiconductor industry, for example. Besides benzocyclobutenes, other low-k dielectrics that feature a low acoustic impedance and may be used for the dielectric layer and the layers of relative low acoustic impedance are known. Examples of low-k dielectrics are aerogels, porous silicates, organosilicates, a siloxane derived from condensed silsesquioxanes, a polyaromatic compound or cross-linked polyphenylene.

If these materials are used for the dielectric layer, then it is also possible in accordance with another embodiment to first planarize the dielectric layer above the resonators and additional circuit elements that may be present. In this process, an embedded surface is obtained for the dielectric layer, which, however, means that different layer thicknesses will be obtained on the dielectric layer above the single resonators, above the wafer, or above other circuit elements. The component may be planarized in such a manner that the layer thickness of the dielectric layer remaining above the resonators corresponds to a λ-quarter layer (or an odd multiple of the λ-quarter layer). A planarized surface of the dielectric layer has the further advantage that it substantially facilitates the further deposit of additional layers and in particular improves adhesion and saves material. With a planar layer deposited over a plurality of resonators and possibly additional circuit elements, there also results a physically loadable surface upon which it is possible to deposit additional structures, such as another metallization plane, electrical terminal pads, solderable terminal pads, for example, permitting the deposit of bumps that make it possible to connect the component to a printed circuit board, a module substrate or an external circuit environment in flip-chip technique.

Embodiments will be explained in more detail below based on the figures associated therewith.

DETAILED DESCRIPTION

Figure 1:
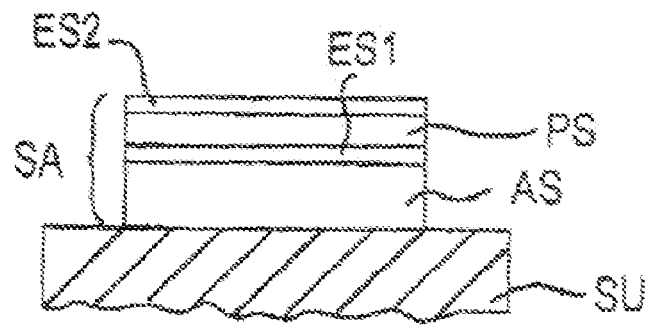
FIG. 1 shows a resonator that has an acoustic mirror and has been deposited on a substrate.

FIG. 1 shows, in schematic cross section, an FBAR resonator known in the art, which is realized as thin-film structure SA on an arbitrary substrate SU. An acoustic mirror AS is provided directly above the substrate, possibly above adaptation layers. The acoustic mirror comprises at least two, maybe three layers, which are more than λ-quarter, alternately having high and low impedance. The actual resonator, comprised of a first electrode layer ES1, a piezoelectric layer PS and a second electrode layer ES2, is constructed above the acoustic mirror AS.

Figure 2:
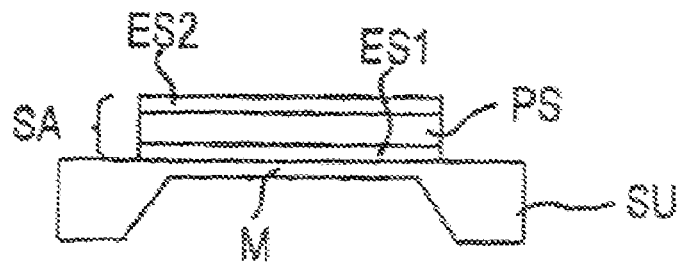
FIG. 2 shows a resonator deposited over an air gap.

FIG. 2 shows an alternative method of manufacturing an FBAR resonator without an acoustic mirror. In this case, the layer structure includes an electrode layer ES1, a piezoelectric layer PS and a second electrode layer ES2. Once the layer structure SA has been made, the substrate is thinned in the vicinity of the resonator, wherein either a thin membrane M remains, or wherein the substrate is removed completely and the bottom electrode layer ES1 is exposed in the vicinity of the resonator.

Figure 3:
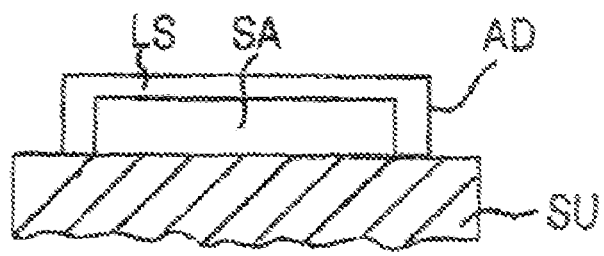
FIG. 3 shows an encapsulation for a resonator.

FIG. 3 shows, in a schematic cross section, a known method of hermetically encapsulating an FBAR resonator. Here the conventionally built layer structure SA, depicted in FIG. 1 and FIG. 2, for example, is covered with a cap-shaped cover AD in such a manner that an air gap LS remains above the layer structure SA so that no deadening of the acoustic vibration can occur. The cover AD may be glued or soldered to the substrate SU or fastened thereto in other ways.

Figure 4:
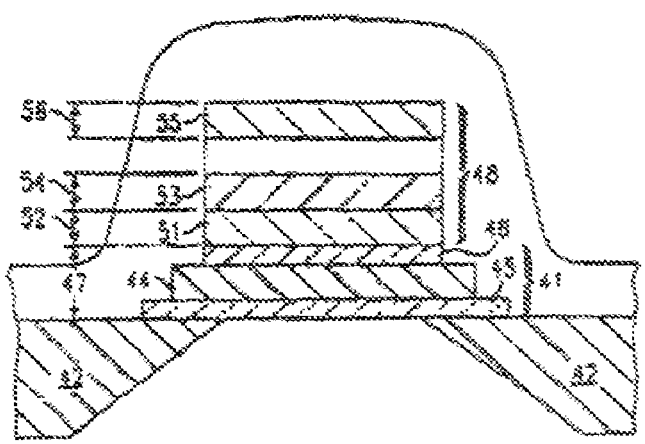
FIG. 4 shows a resonator with a glob top seal.

FIG. 4 shows, in schematic cross section, another method for sealing an FBAR resonator known from U.S. Pat. No. 6,087,198 B, which has already been mentioned. An acoustic mirror 48 comprising at least three layers is arranged above the conventional layer structure 41. The single resonator is next covered with a glob-top paste, such as an epoxy resin which is applied in liquid form and then cured. The glob-top cover of this single resonator is intended to protect it from environmental exposure.

Figure 5:
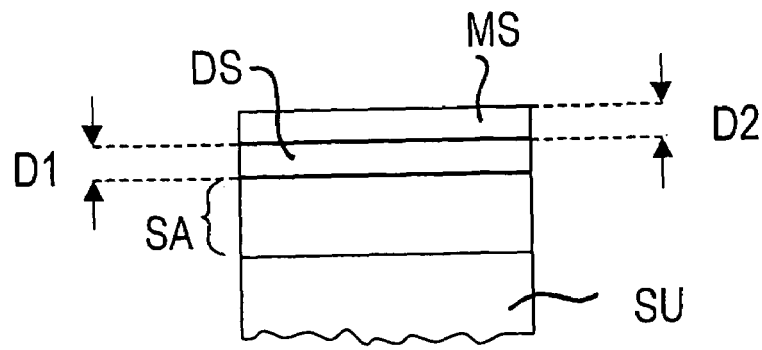
FIG. 5 shows a resonator.

FIG. 5 shows, on the basis of a schematic cross section, parts of a component. This comprises a layer structure SA, which contains the resonator and possibly the acoustic mirror, and is deposited over a substrate SU. The entire resonator realized in the layer structure is now covered with a dielectric layer DS, whose thickness corresponds to approximately one fourth (or an odd multiple thereof) of the wavelength of the acoustic waves propagatable therein. At the same time, the dielectric layer DS serves for sealing the component and may be constructed of an organic low-k dielectric.

A metal layer MS, whose thickness likewise corresponds to one-fourth of a wavelength (or an odd multiple thereof) in the working frequency of the resonator is arranged thereon. The metal is specially selected from the viewpoint of maximum acoustic impedance. The metals tungsten, molybdenum or gold are thus appropriate for the metal layer.

Figure 6:
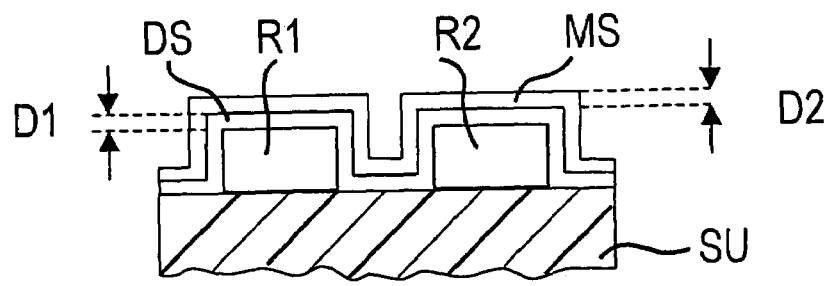
FIG. 6 shows two resonators.

FIG. 6 shows, on the basis of a schematic cross section, a component comprising a plurality of resonators. The figure depicts two resonators R1, R2 structured from one layer structure and arranged on a substrate SU. A dielectric layer of thickness D1, which corresponds to a quarter of the wavelength, is deposited thereon over the total surface. The dielectric layer may be deposited conformal and therefore follows the topology of the resonators R1 and R2. This does not require that the dielectric layer DS have the same layer thickness D1 everywhere, only that the thickness be maintained over the resonators.

A metal layer MS, which at least over the resonators likewise has a layer thickness D2 that corresponds to one-quarter of the wavelength of the resonator working frequency, is arranged over the total surface of the dielectric layer DS. It is clearly evident from the figures that the dielectric layer, which may terminate outside the resonators on the substrate SU, completely covers the resonators R1, R2. The sealing characteristics of the dielectric layer, particularly its low water absorption and low water permeability and its tightness to gases with high molecular volumes and to liquids that are unable to penetrate the cross-linked or linked polymer network, protect the resonator from environmental exposure. Furthermore, the metal layer protects the resonator from physical effects and also does not affect its acoustic properties. This opens the possibility of providing additional layers, structures, metallization planes or soldered joints above the metal layer. At the same time, the metal layer MS provides for electromagnetic shielding of the resonators. This is advantageous for resonators used in filter circuits for front-end modules in mobile communications, especially in the reception unit.

The desired working frequency of the resonator corresponds to the layer thicknesses D1 and D2. If the resonators are used in HF filters for the 2 gigahertz range, for example, then there results, for benzocyclobutene as dielectric layer DS, for example, a layer thickness D1 of approximately 200 nm, which corresponds to a quarter of the wavelength. This value is well below the layer thickness that can be accurately controlled by BCB (benzocyclobutene), for example. As for the layer thickness D2 of the metal layer MS, the resulting layer thickness is between 650 and 700 nm for tungsten, for example, a thickness that can likewise be technically controlled and precisely set. If higher layer thicknesses are desired for the dielectric layer DS and/or metal layer MS for technological reasons (e.g. to better cover the edges of components or to achieve a higher air-tightness), then it is possible to resort to odd multiples of one-quarter of the wavelength for the respective layer thicknesses. Instead of 200 nm of BCB (corresponding to approximately one lambda-quarter layer at a frequency of 2 GHz), 600 nm of BCB (approximately a 3λ/4 layer at a frequency of 2 GHz) may be deposited. The technological advantages achieved by this measure (e.g., better covering of the edges through increased conformity) may be precisely weighed against potential disadvantages in acoustic performance (possibility of higher insertion loss from increased viscous losses in thicker layers).

The layer combination of a low-k dielectric and a high-impedance metal layer first proposed has the further advantage that two layers are sufficient to reflect a high percentage (more than 95%) of the acoustic energy on the boundary surfaces of these two layers back into the resonator. The mirror obtains a high bandwidth from the small number of only two mirror layers. This means that the frequency components lying within the mirror bandwidth can be reflected uniformly well. To be more precise, this means that the layer combination BCB/W, for example, as acoustic reflector for frequencies around 2 GHz, is equally well suited for all such resonators whose frequencies do not deviate more than approximately ±7% from a given frequency, even when the thicknesses of the mirror layers do not exactly agree with the theoretical ideal value λ/4 for the corresponding acoustic wavelengths λ. Alternatively, a thickness tolerance of ±7% may be taken into consideration in this manner for the same frequencies without impermissibly reducing the reflectivity of the layer pair.

The small number of only two layers for creating an acoustic mirror with high reflection and high bandwidth may be particularly attributed to the low acoustic impedance of the low-k dielectric, which is approximately an order of magnitude lower than for conventional mirror layers having low impedance, especially than for $SiO_2$, which has been used until now. The high mirror bandwidth permits layer thickness fluctuations of ±7%. For a 200-nm layer thickness for BCB, this corresponds to maintaining a precision of ±14 nm. This is easy to maintain, because it is possible to produce BCB with a layer thickness accuracy of ±0.5% according to the state of the art. Still higher layer thickness accuracies can be attained for depositing the metal layer MS. It is moreover possible, besides the layer thickness of λ-quarter, to increase the layer thicknesses to odd multiples of λ-quarter. This may be advisable for the metal layer, for example, in order to create a physically solid and solderable surface, for example. There is no problem in thickening the metal layer because a large portion of the acoustic wave already occurs on the boundary surface from resonator R or from the layer structure SA to the dielectric layer DS.

Since only a small portion of the acoustic energy is thus able to penetrate the metal layer MS at all, it is much less critical to prevent reflection based on a layer thickness D2 that is inexactly set to λ-quarter, so that a 50% layer thickness accuracy for the metal layer MS is sufficient, for example. This may be important, because layer thickness tolerances may usually only be maintained as percentages, whereas the absolute tolerance or deviation prevails for an acoustic mirror.

Figure 7:
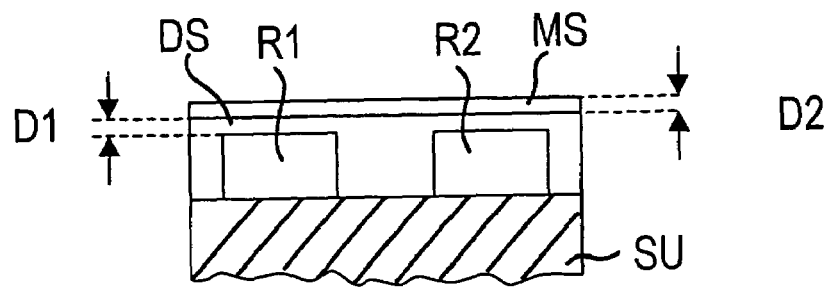
FIG. 7 shows two resonators with one planarized dielectric layer.

FIG. 7 shows, in schematic cross section, another embodiment. It too presents a component, which comprises a plurality of resonators R1, R2 and is produced as layer structure on a substrate SU. In contrast to the embodiment illustrated in FIG. 6, here the dielectric layer DS is likewise deposited on the total surface, but then planarized. The dielectric layer thus has different layer thicknesses, because the open spaces between the resonators R1, R2 are likewise filled with the material of the dielectric layer DS. For an appropriate material dimensioning and suitable for controlled process, it is also possible to set the thickness D1 to the desired value of λ-quarter for the planarization of the dielectric layer above the resonators R1, R2. This facilitates the deposit of additional layers, especially the metal layer MS, over such a planarized dielectric layer DS. One standard method of planarizing dielectric layers such as BCB is chemical mechanical polishing (CMP) of the surface. Here it is possible to set the required mirror layer thickness without significantly increasing the roughness of the dielectric. Only sub-nm roughnesses arise.

Figure 8:
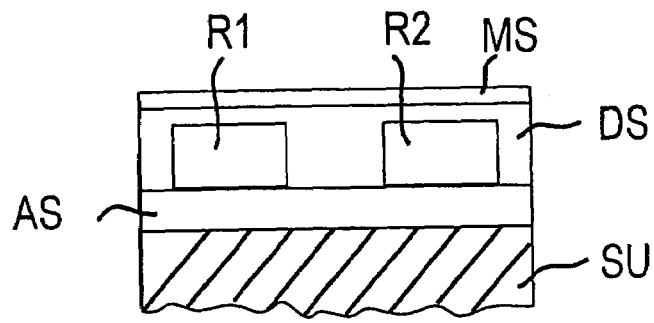
FIG. 8 shows the fitting arrangement having a continuous bottom acoustic mirror.

FIG. 8 shows another embodiment in which one single acoustic mirror AS may be used for a series of resonators R1, R2. In a common filter circuit, such as a ladder-type circuit, a distinction is made for example between resonators arranged in series and the resonators arranged in parallel branches, besides the fitting arrangement in the circuit a distinction also existing in the fact that a different resonance frequency is set. Besides a broadband acoustic mirror AS, which is deposited above the resonators in the form of dielectric layer DS and the metal layer MS, a similar broadband mirror may similarly be provided between the substrate and the resonators. Here too, two mirror layers suffice to attain broadbandedness for a layer combination comprising low-k dielectric and high-impedance metal layer in order to ensure high reflection exceeding 95%. Here the broadbandedness of the acoustic mirror is used to make the same reflectivity available for the different frequencies of parallel and serial resonators.

Figure 9:
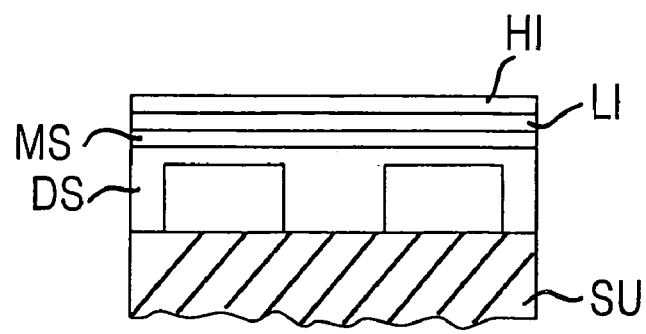
FIG. 9 shows a component having another layer pair above the metal layer.

FIG. 9 shows, in schematic cross section, another embodiment in which the layers are deposited over the metal layer. In particular, these layers may be additional low-impedance layers NI and a high-impedance layer HI in alternating sequence. But since the combination dielectric layer/metal layer already possesses adequate reflection for the acoustic wave in the range of the resonance frequency, the acoustic impedance of the additional layers LI, HI is of only minor importance. However, a layer of lower impedance may be created directly above the metal layer.

Figure 10:
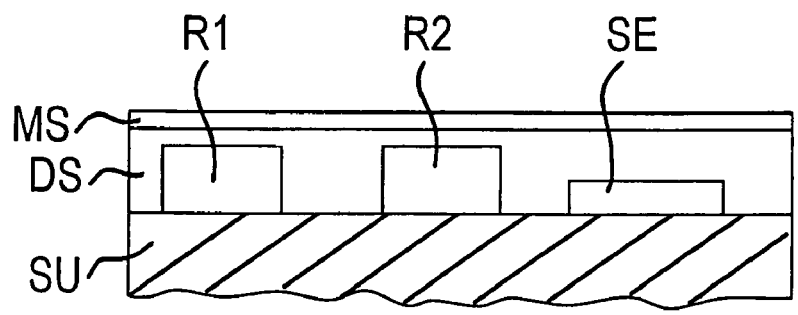
FIG. 10 shows a component within which one further circuit element is integrated.

FIG. 10 shows, in schematic cross section, a component that has been expanded by an additional circuit element SE and which is likewise completely encapsulated with the dielectric layer and the metal layer. The additional circuit element SE may be an active circuit component, such as an integrated circuit, IC. In addition, the circuit element SE may also be a passive component, such as an inductive, capacitive, or resistor element structured by metallizing. This circuit element SE may be interconnected with the resonators R1, R2 and form an adaptation circuit, for example. The encapsulation makes it possible to provide arbitrary circuit elements and encapsulate them in common and to therefore also produce arbitrary circuits having the resonators R1, R2.

In an embodiment, a duplexer circuit, which is suitable for the mobile radio standard UMTS, is produced. Both RX and TX filters are constructed from FBAR resonators, which may be formed from the same layer structure SA by structuring. The different resonance frequencies that are needed are set by additional layer deposit, by additional separating layers or by structured cutting of a layer to the required layer thickness. The dielectric layer is deposited over all serial and parallel resonators as a λ-quarter mirror layer having a thickness of 220 nm. The acoustic impedance of BCB is equal to $1.7 \times 10^6$ $kg/sm^2$. A tungsten layer with a thickness of approximately 680 nm is deposited as a high-impedance layer or as a metal layer. Its impedance is then $94 \times 10^6$ $kg/sm^2$. Because of the low sensitivity of the reflection on the layer thickness of the metal layer, the same results are obtained with a layer thickness of up to 1 μm.

A common acoustic mirror may be provided for all resonators. In another embodiment, it is possible in a suitable structuring step, which already occurs when the layers are deposited, to separate the electrically conducting mirror layers on the basis of resonators to be capacitatively decoupled, particularly the metal layer and the layers of the acoustic mirror comprised of metal and located below the resonators, in order to prevent capacitive coupling between individual resonators.

Figure 11:
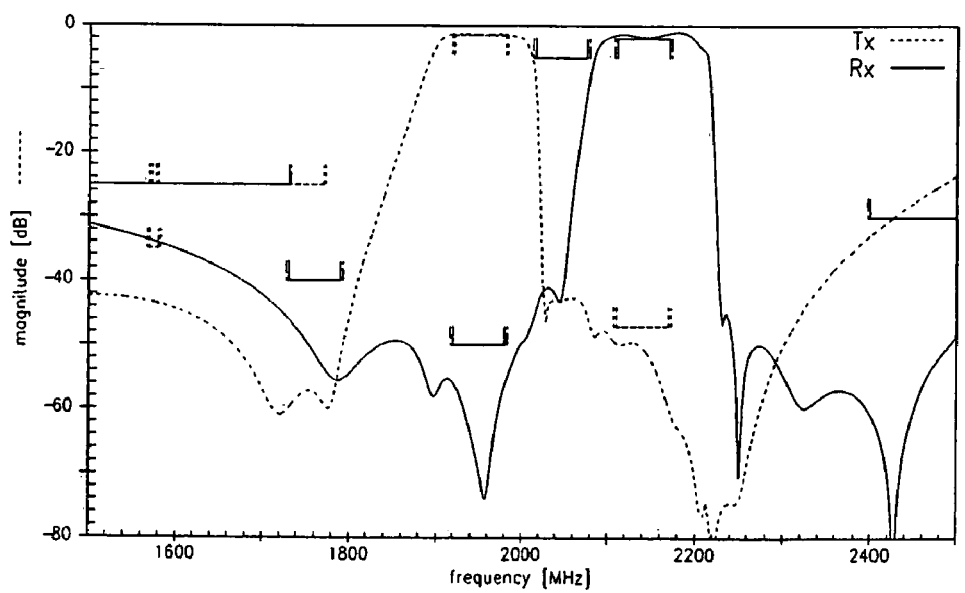
FIG. 11 shows the simulated forward behavior of a duplexer constructed of resonators having a mutual encapsulation.

FIG. 11 shows the simulated forward behavior (contributions of the complex transmission functions S(Ant, Rx) and S(Ant, Tx) of the complex 3-port duplexer scattering matrix) of a duplexer built in this manner from FBAR resonators with a mutual encapsulation. It can be seen that the structure well satisfies the typical requirements placed on the forward behavior of a UMTS duplexer, for both Rx and for Tx filters.

The electrical interconnection of the resonators, which may be attained through appropriate structuring of the electrode layer E1, E2 (see, for example, FIGS. 1 and 2) in correspondence with a desired interconnection, such as a ladder-type circuit, is not illustrated in the figures. The electrode layers ES may also be structured in such a manner that electrical terminal pads can be produced on the surface of the substrate SU outside the region stressed by the resonators. These terminal pads may then be made accessible either from above or below. From above, this requires the removal of the dielectric layer and metal layer and possibly other layers deposited thereon. It is also possible to provide a feed-through through the aforementioned layers and to completely fill the feed-through with a conductive material, for example. For contacting from below, feed-throughs may be provided in the substrate. From above, it is also possible to contact exposed terminal pads by soldering on bonding wires. It is also possible to provide integrated wiring that connects the terminal pads to a metallization structure that is electrically insulated from the metal layer arranged above the metal layer MS. The abovementioned electrical connections, like connections through bonding wires or direct connection with flip-chip bonds, may be performed in this metallization plane. Flip-chip bonding is also possible with terminal pads or with terminal pads that are provided directly on the substrate surface and distant from the dielectric layer DS and metal layer MS.

For the sake of clarity, only a few exemplary embodiments have been presented. But the claims are not limited to the presented examples and may be further varied. Such variations may include additional layers or structures, different number and fitting arrangement of resonators next to or above each other into SCF filters or CRF filters and/or additional circuit elements SE, which may possibly also be provided above the metal layer MS. The realizable circuits to be encapsulated are also not limited to the described examples.

The invention claimed is:

1. A component comprising:
a plurality of resonators that form at least a portion of a circuit;
wherein the plurality of resonators comprise layer structures above a wafer, wherein each of the layer structures comprises first and second electrode layers that comprise electrodes, and at least one piezoelectric layer that is between the first and second electrode layers;
a dielectric layer above the plurality of resonators, the dielectric layer comprising a hermetic encapsulation for the plurality of resonators, the dielectric layer comprising a material and having a thickness that results in a first acoustic impedance, the material comprising a low-K dielectric, the dielectric layer having top and bottom surfaces that substantially follow a topology of the plurality of resonators; and
a metal layer above the dielectric layer, the metal layer comprising a material and having a thickness that results in a second acoustic impedance, the second acoustic impedance being higher than the first acoustic impedance, the metal layer and the dielectric layer being parts of an acoustic mirror;
wherein the wafer has a surface comprising solderable contacts that are electrically connected to the plurality of resonators or to one or more of a plurality of active and/or passive components integrated with the plurality of resonators in circuits; and
wherein the plurality of resonators are electrically interconnected by electrode layers of the resonators to form the at least a portion of a circuit.

2. The component of claim 1, wherein the component comprises a bulk acoustic resonator that operates with bulk acoustic waves; and
wherein thicknesses of the dielectric layer and the metal layer are in a range of a quarter wavelength of the bulk acoustic waves.

3. The component of claim 1, wherein the solderable contacts are electrically connected to one or more of the plurality of active and/or passive components via feed-throughs in the wafer.

4. The component of claim 1, wherein the solderable contacts are electrically connected to the plurality of resonators via feed-throughs in the wafer.

5. The component of claim 1, wherein the dielectric layer comprises an organic layer.

6. The component of claim 1, wherein the dielectric layer comprises benzocyclobutenes.

7. The component of claim 1, wherein the dielectric layer is over an entire surface of the wafer and over the plurality of resonators.

8. The component of claim 1, wherein the acoustic mirror comprises at least one other layer pair arranged above the metal layer, the at least one other layer pair comprising layers having different acoustic impedances.

9. The component of claim 1, wherein the component comprises a bulk acoustic resonator that operates with bulk acoustic waves; and
wherein a thickness of the metal layer is in a range of a quarter wavelength of the bulk acoustic waves or in a range of an odd multiple of the quarter wavelength.

10. An apparatus comprising:
plural components according to claim 1.

11. The component of claim 1, wherein the acoustic mirror comprises one other layer pair arranged above the metal layer, the one other layer pair comprising a layer having a first acoustic impedance and a layer having a second acoustic impedance, the first acoustic impedance being less than the second acoustic impedance.

12. The component of claim 1, wherein the metal layer comprises at least one of tungsten (W), molybdenum (Mo), gold (Au) and aluminum nitride (AlN).

13. The component of claim 1, wherein the low-k dielectric comprises at least one of an aerogel, a porous silicate, an organosilicate, a siloxane derived from condensed silsesquioxanes, a polyaromatic compound, a cross-linked polyphenylene, and a polymerized benzocyclobutene.

14. The component of claim 1, wherein the component comprises a bulk acoustic resonator that operates with bulk acoustic waves; and
wherein a thickness of the dielectric layer is in a range of a quarter wavelength of the bulk acoustic waves or in a range of an odd multiple of the quarter wavelength.

15. The component of claim 1, wherein the solderable contacts are electrically connected to the plurality of resonators or to one or more of the plurality of active and/or passive components via feed-throughs in the wafer.

16. The component of claim 1, wherein the component comprises a bulk acoustic wave resonator, a stacked crystal filter, or a coupled resonator filter.

17. The component of claim 1, wherein the acoustic mirror comprises at least one other layer pair arranged above the metal layer, the at least one other layer pair comprising a layer of relatively low acoustic impedance and a layer of relatively high acoustic impedance.

18. The resonator of claim 1, wherein the dielectric material comprises at least one of an aerogel, a porous silicate, an organosilicate, a siloxane derived from condensed silsesquioxanes, a polyaromatic compound, a cross-linked polyphenylene, and a polymerized benzocyclobutene.

19. The resonator of claim 1, wherein the metal layer comprises one of tungsten (W), molybdenum (Mo), gold (Au) and aluminum nitride (AlN).

20. The resonator of claim 1, wherein the solderable contacts are electrically connected to one or more of the plurality of active and/or passive components.

21. The component of claim 1, wherein the low-k dielectric comprises one of an aerogel, a porous silicate, an organosilicate, a siloxane derived from condensed silsesquioxanes, a polyaromatic compound, a cross-linked polyphenylene, and a polymerized benzocyclobutene.

22. The component of claim 1, wherein the component comprises a bulk acoustic resonator that operates with bulk acoustic waves; and
   wherein thicknesses of the dielectric layer and the metal layer are in a range of an odd multiple of a quarter wavelength of the bulk acoustic waves.

23. The component of claim 1, wherein the acoustic mirror comprises at least one other layer pair arranged above the metal layer, the at least one other layer pair comprising a layer having a first acoustic impedance and a layer having a second acoustic impedance, the first acoustic impedance being less than the second acoustic impedance.

24. The component of claim 1, wherein layers forming the acoustic mirror comprise an encapsulation for the active or passive circuit elements and the plurality of resonators.

25. The component of claim 24, wherein the plurality of resonators and the active or passive circuit elements comprise parts of a circuit on the wafer, the circuit comprising one or more of a high-frequency circuit, an adaptation circuit, an antenna circuit, a diode circuit, a transistor circuit, a highpass filter, a lowpass filter, a bandpass filter, a filter having a tunable frequency, a power amplifier, a preamplifier, an LNA, a diplexer, a duplexer, a multifilter, a coupler, a directional coupler, a memory element, a balun, a mixer, and an oscillator.

* * * * *